United States Patent [19]

Sakamoto et al.

[11] 3,713,041

[45] Jan. 23, 1973

[54] INJECTION TYPE FREQUENCY LOCKED OSCILLATOR APPARATUS

[75] Inventors: Kazuo Sakamoto; Ryoji Tamura, both of Minato-ku, Tokyo, Japan

[73] Assignee: Nippon Electric Company Limited, Tokyo, Japan

[22] Filed: Dec. 14, 1971

[21] Appl. No.: 207,881

[30] Foreign Application Priority Data

Dec. 14, 1970 Japan ..............................45/110492

[52] U.S. Cl.....................331/44, 331/96, 331/107 G, 331/117 D, 331/172

[51] Int. Cl..........H03b 3/06, H03b 5/18, H03b 7/14

[58] Field of Search..........331/44, 47, 55, 96, 107 G, 331/117 D, 172

[56] References Cited

UNITED STATES PATENTS

| | | | |
|---|---|---|---|
| 3,304,518 | 2/1967 | Mackey | 331/172 X |
| 3,588,735 | 6/1971 | Chang et al. | 331/47 |

*Primary Examiner*—Roy Lake
*Assistant Examiner*—Siegfried H. Grimm
*Attorney*—Richard C. Sughrue et al.

[57] ABSTRACT

An injection-type frequency-locked oscillator provided with novel means for monitoring the operation of the oscillator. An injection input wave is applied through a directional coupler to an auxiliary terminal of the oscillator having a separate output terminal connected to a load. The coupler separates the injection input wave from the oscillator output wave. The output impedance of the oscillator is matched to the load impedance; however, the input impedance of the oscillator at the auxiliary terminal is mismatched to the output impedance of the coupler with respect to the injection input wave, thereby producing in the coupler a reflected injection input wave which is 180° out of phase with the oscillator output wave when the oscillator is frequency-locked at the center frequency of the injection input wave. The signal level at a monitoring terminal of the coupler provides a monitoring signal indicative of the degree of frequency-locking of the oscillator.

8 Claims, 7 Drawing Figures

INJECTION TYPE FREQUENCY LOCKED OSCILLATOR APPARATUS

BACKGROUND OF THE INVENTION

1. Field of the Invention

The present invention relates to an injection-locking oscillator apparatus in which the monitoring of the performance of the injection locking oscillation is effected with a very simple construction.

2. Description of the Prior Art

In satellite tele-communication, the frequency-division multiplexing or time-division multiplexing technique is used to make it possible to utilize one satellite in common to a number of stations. However, since the orbit tends to fluctuate even in a stationary satellite, thereby causing frequency deviations at every ground station, the problem of synchronization between a transmitting ground station and a receiving ground station is very important. Therefore, a system of so-called injection locking oscillation is adopted. In this system, the frequency of the local oscillator of the receiving ground station is forcibly locked to that of a carrier wave received from the transmitting ground station. While the invention relates to such injection-type locked oscillation, it is applicable not only to the local oscillator of a ground station in a satellite communication but also to oscillators for other use. Hence, the following description will be given on the assumption that the receiving wave, which serves as an injection locking input, is supplied from an injection-locking input wave source.

Although the construction for effecting the injection-locking type oscillation itself is very simple, a device for monitoring the performance of the frequency-locking of the oscillator is needed for practical use. In conventional oscillator apparatus of this type, the monitoring of the performance of the injection type oscillation relies solely on the method of monitoring the phase difference between the injection input and the injection locking load output wave. Therefore, the circuit for monitoring the performance is very complicated in construction in view of the fact that the construction for effecting the injection type oscillation itself is relatively simple.

In conventional injection-type locked oscillators, the monitoring is performed as follows: Small portions of the injection input and the output of the oscillator to be locked are respectively branched out by branching means and applied to a phase detector through an attenuator and/or phase shifter. The output of the phase detector represents the state of operation of the oscillator to be locked. Such a conventional oscillator must have a branching means, a phase shifter, a variable attenuator and a phase detector, thereby resulting in a complicated construction as a whole.

SUMMARY OF THE INVENTION

Therefore, an object of the present invention is to provide an injection-type frequency locked oscillator apparatus which has very simple construction.

According to one embodiment of the invention, there is provided an oscillator apparatus of this type in which the oscillator to be locked has, in addition to the usual load output terminal, another auxiliary output terminal. The injection-locking input is applied to the auxiliary terminal through one terminal of a directional coupling circuit, such as a circulator, so that the injection-locking input and the output at the auxiliary terminal may be separated, and so that the output wave of the oscillator and the reflected wave at said auxiliary terminal may be taken out at another terminal of the directional coupling circuit. More specifically, the oscillator output terminal to be connected to the load is naturally matched to the load, while the internal impedance of the oscillator as seen from the auxiliary terminal, i.e. the input impedance of the oscillator to be locked, is selected to be mismatched with the characteristic impedance of the transmission line for the locking input. Since the auxiliary terminal is the one for applying the injection-locking input wave, no trouble is caused even in the mismatched state. Thus, by applying the injection locking input wave from the auxiliary terminal to the oscillator, the injection input and the output wave of the oscillation output are brought in-phase when the intended injection-type locking oscillation state is achieved. On the other hand, if the mismatched state is such that the auxiliary terminal input impedance is sufficiently small relative to the characteristic impedance of the transmission line for the injection input and such that, with respect to the injection input wave, the reflection coefficient $k$ thereof is substantially close to a real number within the range of $0>k>-1$ so that the imaginary part of said reflection coefficient is negligible, then the injection input wave is reflected with a phase inversion of 180°. As a result, the reflected wave differs in phase by 180° from the output wave of the oscillator to be locked. Accordingly, if the output wave of the oscillator and the reflected wave are equal in level, they are cancelled out, and the monitoring signal becomes zero level. Then, in the case where the level of the injection input is fixed at a value to bring the monitoring signal to zero level at the center frequency of the injection locking oscillation, a phase difference appears between the injection input and the output of the oscillator to be locked as soon as the oscillation frequency is caused to deviate from the injection input frequency. Eventually, the phase difference between the reflected wave of the injection input and the oscillation output deviates from 180°. Thus, even if the levels of the reflected wave and the output wave are equal, they tend to remain uncancelled in proportion to the frequency deviation. Therefore, the monitoring signal is gradually increased from zero in proportion to the frequency deviation. When the frequency deviation is then further increased, the injection locking oscillation is not maintained, and the monitoring signal becomes the sum of the reflected component of the injection input and the oscillation output power.

Based on the facts described above i.e. the fact that the level of the monitoring signal is proportional to the frequency deviation of the oscillation output from the injection input, the present invention implements the monitoring operation with a simple circuit construction.

BRIEF DESCRIPTION OF THE PREFERRED EMBODIMENTS

Figure 1:
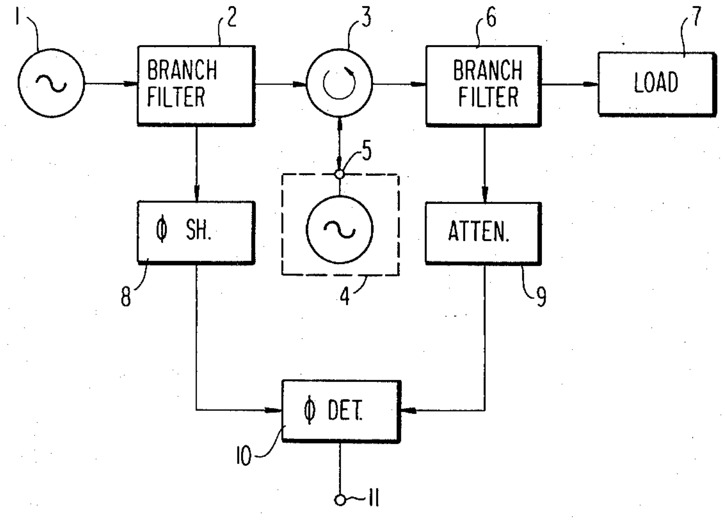
FIG. 1 PRIOR ART
FIG. 1 is a schematic block diagram of a conventional injection-type frequency-locked oscillator apparatus including a circuit for monitoring performance of the oscillator.

FIG 1 shows a conventional system wherein an injection locking input wave is applied from an injection-locking input wave source 1 to a circulator 3 through a branching filter 2. A small portion of electric power is thus branched out for phase comparison with the oscillator output as described later. The portion of electric power applied to the circulator is then applied to an output terminal 5 of the oscillator 4 to be locked. The output of the oscillator 4 is supplied from the output terminal 5 to the circulator 3. As in the case of the injection input, a portion of the oscillator output wave is branched at a branching filter 6 for the phase comparison, and the remainder is supplied to a load 7.

The outputs of the branching filters 2 and 6 are applied, respectively, though a phase shifter 8 and an attenuator 9, to a phase detector 10 for phase comparison. Phase shifter 8 and attenuator 9 are included merely to provide for readjustment of the signals to be phase-compared and may be connected at various places in the system in order to accomplish this function. Phase shifter 8 and attenuator 9 are adjusted so that the phase difference at the phase detector 10 becomes zero when frequency locking is achieved, thereby providing monitoring of the injection-locking operation.

However, since this conventional system of FIG. 1 is based on the direct phase-comparison between the oscillation output and the injection input, it requires components, such as phase shifter 8, attenuator 9, phase comparator 10, thereby resulting in a complicated circuit structure compared with the simple combination for effecting the injection-type locking itself.

Figure 2:
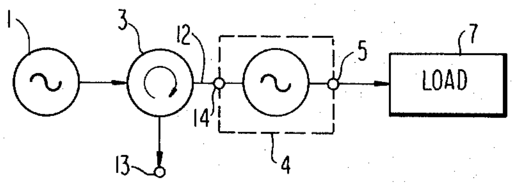
FIG. 2 is a schematic block diagram of a preferred embodiment of an injection-type frequency-locked oscillator apparatus according to the present invention.

FIG. 2 shows a schematic block diagram of a preferred embodiment of the present invention. In this embodiment, an auxiliary terminal 14 is provided for an output of the oscillator 4 in addition to the load output terminal 5 for connection to the load 7. Furthermore, the injection input is applied to the auxiliary terminal 14 through circulator 3 so that the injection input and the output wave of oscillator 4 remain separated from each other.

The impedance at load output terminal 5 is matched to the impedance of load 7; however, the internal impedance of oscillator 4 seen from auxiliary terminal 14 is maintained at a degree of mismatch, with respect to the characteristic impedance of the transmission line 12 for the injection input, such that the reflection coefficient $k$ falls within the range of $0>k>-1$ and is close to a real number while the imaginary part thereof is negligible. In this manner, simultaneously with an output wave of oscillator 4, there appears at terminal 13 of circulator 3 a reflected wave of the injection input wave, which reflected wave differs in phase by 180° from the input wave.

Since the injection input and the oscillation output of oscillator 4 are in phase at the desired center frequency of oscillation, the oscillation output and the reflected component of the injection input differ in phase by 180° from each other at the terminal 13 of the circulator 3 at this center frequency. Accordingly, if their levels are set equal to each other, the signal level at terminal 13 becomes zero. More specifically, if the reflection coefficient $k$ satisfies the above-mentioned condition at the center frequency of oscillation, a certain injection input level exists at which the signal at terminal 13 becomes zero. Thus, the signal at terminal 13 serves as a monitoring signal representing the state of oscillation of oscillator 4.

Figure 3:
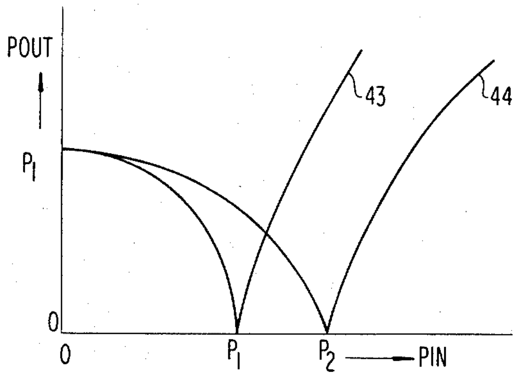
FIG. 3 is a diagram of the monitoring characteristic of the embodiment of FIG. 2.

FIG. 3 shows how the monitoring signal level at the terminal 13 becomes zero at the center frequency of the injection locking oscillation. In FIG. 3, the abscissa $P_{IN}$ represents the injection input power level, and the ordinate $P_{OUT}$ the monitoring signal output level at the terminal 13. When the injection input level $P_{IN}$ is zero, $P_{OUT}$ comprises only the output of the oscillator 4 and, hence, is equal to the output level $P_1$ of oscillator 4. As the injection input level $P_{IN}$ is gradually increased from zero, the reflected wave at the terminal 13 also increases in proportion to $P_{IN}$. Since the oscillation output of oscillator 4 and the reflected component of the injection input have a phase difference of 180° and since the output level $P_{OUT}$ is the summation of these two waves, $P_{OUT}$ begins to decrease from the value $P_1$ in proportion to the increase in the injection input level $P_{IN}$. When the injection input level $P_{IN}$ is further increased, a certain level thereof is reached at which the output level $P_1$ and the level of the reflected component of the injection input become equal, with the result that $P_{OUT}$ becomes zero.

Therefore, when the reflection coefficient $k$ is $-1$, i.e., when the injection input is totally reflected, $P_{OUT}$ becomes zero at $P_{IN} = P_1$. When $P_{IN}$ is then further increased, the reflected component becomes higher in level than the oscillation output, and $P_{OUT}$ begins to increase again. A curve 43 in FIG. 3 shows these relationships. As $k$ becomes larger than $-1$, the reflection of the injection input is decreased. For this reason, the level $P_2$ of $P_{IN}$ at which $P_{OUT}$ is zero becomes larger than $P_1$, and a performance curve 44 in FIG. 3 is obtained. However, if the reflection coefficient $k$ falls within the range of $0>k>-1$, there always exists a level $P_2$ of $P_{IN}$ at which $P_{OUT}$ becomes zero.

Figure 4:
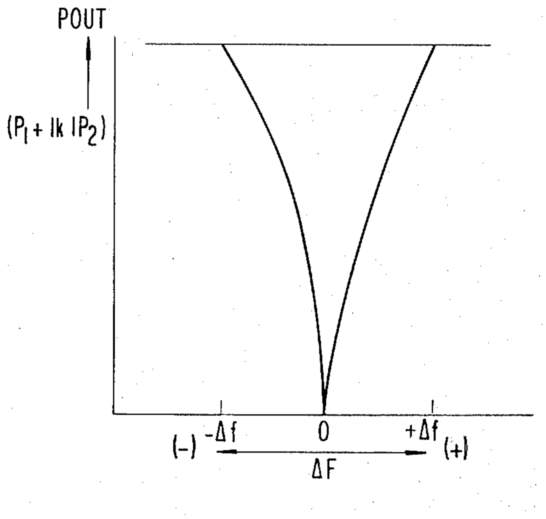
FIG. 4 is a graph showing a performance monitoring characteristic of the preferred embodiment of the present invention.

In FIG. 4 abscissa $\Delta F$ represents the deviation of the oscillation frequency from the injection input frequency. It is assumed here that the center frequency of the injection input appears at point 0. Signs (+) and (−) indicate whether one of the frequencies is higher or lower than the other. The reference character $\Delta f$ represents the half-power width of the oscillation. Other reference characters $P_{OUT}$, $P_1$ and $P_2$ are the same as in FIG. 3. If $P_{IN}$ is fixed at level $P_2$ where $P_{OUT}$ becomes zero at the center frequency of the injection locking oscillation in conformity with the performance characteristic shown in FIG. 3, $P_{OUT}$ becomes zero at $\Delta F = 0$. If the above-mentioned frequency deviation then occurs, a phase difference appears in proportion to the deviation. As a result, the phase difference between the oscillation output and the reflected component of the injection input wave is caused to deviate from the aforesaid 180° in proportion to the frequency deviation. Accordingly, $P_{OUT}$, which had been cancelled upon the establishment of the 180°-phase difference at the center frequency of the injection locking oscillation, gradually rises to a certain level. Since the phase difference between the injection input and the oscillation output of the oscillator 4 is similarly proportional to the positive and negative frequency deviation, the increase in $P_{OUT}$ is symmetrical. The greater the frequency deviation is, the greater $P_{OUT}$ will be. Thus, the oscillation leaves the locked state at the point where the frequency deviation is $\Delta f$. When the locked state collapses, $P_{OUT}$ becomes the sum of $P_1$ and the reflection component of the injection input, i.e. $|k| \times P_2$.

As has been stated, since the output characteristic of $P_{OUT}$ is proportional to the above-defined frequency deviation or phase deviation, monitoring of the locked state of the oscillator can be achieved by the use of this output $P_{OUT}$.

Figure 5:
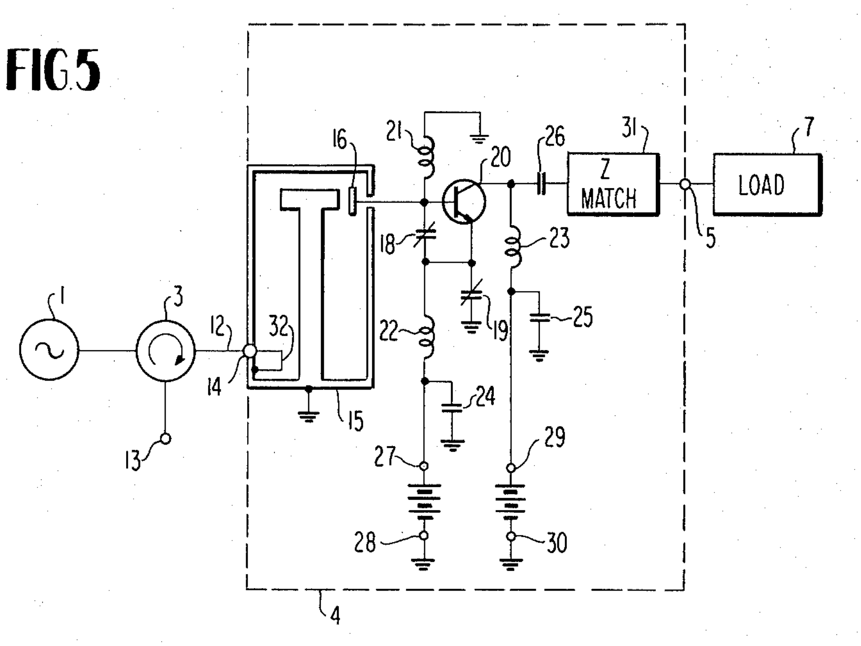
FIG. 5 is a detailed circuit diagram of an embodiment in which a transistor oscillator is employed as the oscillator.

FIG 5 is a detailed circuit diagram of a preferred embodiment of the present invention. In this embodiment, a transistor oscillator constitutes the oscillator to be locked. The oscillator is composed of a transistor 20, variable capacitors 18 and 19, a capacitive re-entrant cavity resonator 15, and a coupling disc 16. The oscillation frequency is substantially determined by the resonant frequency of the capacitive re-entrant cavity resonator 15. The DC bias circuit for the transistor 20 is composed of choke coils 21, 22 and 23 and by-pass capacitors 24 and 25. A forward bias voltage is supplied across terminals 27 and 28, and a back bias voltage is supplied across terminals 29 and 30. The output is caused to pass through a DC blocking capacitor 26 to output terminal 5 through an impedance matching circuit 31 which matches the output impedance to the load 7. To the auxiliary terminal 14 from which the injection input is supplied to the oscillator 4, there is connected a coupling loop 32 disposed in the capacitive re-entrant cavity resonator 15. The injection input from the source 1 is applied through the circulator 3 to the auxiliary terminal 14. Accordingly, the output wave from the auxiliary terminal 14 of the oscillator 4 and the reflected component of the injection input from the auxiliary terminal 14 are taken out at the terminal 13 as the monitoring signal.

The internal impedance of the oscillator 4 seen from the auxiliary terminal 14, or in other words, the input impedance of the oscillator 4 at the auxiliary terminal 14, is selected to cause a mismatch with respect to the characteristic impedance of the transmission line 12 for the injection input connected to the auxiliary terminal 14. The degree of mismatch is selected such that the reflection coefficient $k$ for the injection input wave falls within the range of $0 > k > -1$ and is close to a real number so that the imaginary part can be considered to be negligible. The reflection co-efficient $k$ may be arbitrarily selected by the setting of the coupling loop 32. If injection locking is to be attained under this condition, there exists a certain injection input level $P_2$ which makes the output $P_{OUT}$ at terminal 13 zero as shown in FIG. 3. If $P_{IN}$ is fixed at $P_2$, $P_{OUT}$ will have the output characteristic shown in FIG. 4 as the frequency of the free running oscillation of the oscillator deviates from the injection input frequency. Thus, monitoring of the frequency-locked oscillation becomes feasible.

It will be apparent that this embodiment of the invention is much simpler than the conventional system shown in FIG. 1, particularly in terms of the means for carrying out the monitoring.

Figure 6:
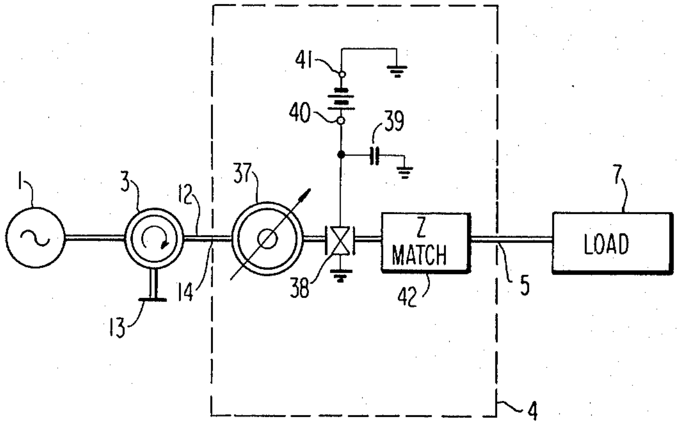
FIG. 6 is another circuit diagram of an embodiment in which a Gunn diode is employed as the oscillator.

In FIG. 6 which shows a circuit diagram of another embodiment of the present invention, a Gunn diode 38 is mounted on a mount of the waveguide means, constituting an oscillator circuit together with a cylindrical cavity resonator 37. The oscillation frequency is substantially determined by the resonant frequency of the cylindrical cavity resonator 37. The bias voltage for the Gunn diode is applied across terminals 40 and 41 bypass capacitor 39 being connected between terminal 40 and ground. An output circuit similarly employs a waveguide. An output is taken out from the output terminal 5 through an impedance matching circuit 42 matched to the load 7.

The auxiliary terminal 14 of the oscillator 4 is composed of a coupling window or aperture formed in a wall of the cylindrical cavity resonator. The injection input is applied through a circulator 3 to the auxiliary terminal 14. Accordingly, the output of the oscillator 4 from the coupling window and the reflected component of the injection input at the auxiliary terminal 14 are taken out at the terminal 13.

The input impedance of the oscillator 4 is selected as in the case of the embodiment of FIG. 5. The reflection coefficient $k$ may be arbitrarily selected by suitably setting the dimensions of the opening of the coupling window. The performance of the frequency locking and monitoring is similar to that of the embodiment of FIG. 5. Therefore, no further description will be given as to this embodiment.

Figure 7:
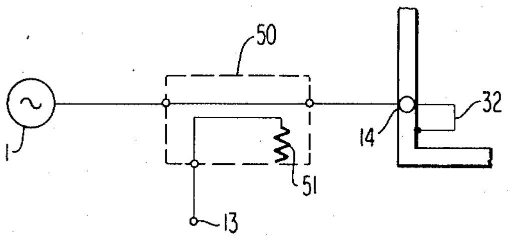
FIG. 7 is a diagram showing a modification of the embodiment of FIG. 5.

FIG. 7 shows modification of the embodiment in FIG. 5 and employs a directional coupler in place of the circulator. As will be apparent from FIG. 7, the directional coupler 50 coupled with a dummy load 51 functions just like the circulator in FIG. 5.

As described above, according to the present invention, the monitoring of an injection-type frequency-locked oscillation is carried out with a very simple construction in such a way that the injection input may be applied to an auxiliary terminal of the oscillator to be frequency-locked.

The principle of the present invention may be applied over a wide frequency range, extending to the UHF and SHF band, by the use of a transistor oscillator (FIG. 5) adapted to the UHF-band and a Gunn diode oscillator (FIG. 6) adapted to the SHF-band.

What is claimed is:

1. An injection-type frequency-locked oscillator apparatus comprising:

a. an input terminal for receiving an injection input wave;

b. an oscillator to be frequency-locked to the frequency of the injection input wave and having:

1. a load output terminal for connection to a load, and
2. an auxiliary output terminal;

c. directional coupling means coupled between said input terminal and said auxiliary terminal for supplying the injection input wave to said oscillator through said auxiliary terminal;
d. a monitoring terminal on said directional coupling means; and wherein:
e. the output impedance of said oscillator is matched to the impedance of the load, and the input impedance of said oscillator at said auxiliary terminal is mismatched to the output impedance of said directional coupling means with respect to the injection input wave; whereby an oscillation output wave and a reflected input injection wave are produced in said directional coupling means, so that the signal level at said monitoring terminal is indicative of the degree of frequency-locking of said oscillator.

2. Apparatus as defined in claim 1 further comprising means coupled to the output of said oscillator for matching the oscillator output impedance to the impedance of a load connected to the oscillator output.

3. Apparatus as defined in claim 1 further comprising circuit means connected to said auxiliary terminal of said oscillator for mismatching said input impedance of said oscillator with said output impedance of said directional coupling means.

4. Apparatus as defined in claim 3 wherein said circuit means comprises means for selecting the mismatch, so that the reflection co-efficient of the reflected injection input wave is substantially close to a real number between 0 and -1 and has a negligible imaginary component.

5. Apparatus as defined in claim 1 wherein said oscillator comprises a transistor oscillator circuit capable of operating in the UHF band.

6. Apparatus as defined in claim 1 wherein said oscillator comprises a Gunn diode oscillator capable of operating in the SHF band.

7. Apparatus as defined in claim 1 wherein said directional coupling means comprises a circulator.

8. Apparatus as defined in claim 1 wherein said directional coupling means comprises a directional coupler.

* * * * *